United States Patent [19]
Graf

[11] Patent Number: 5,811,989
[45] Date of Patent: *Sep. 22, 1998

[54] PROGRAMMABLE I/O CELL WITH DATA CONVERSION CAPABILITY

[75] Inventor: W. Alfred Graf, Saratoga, Calif.

[73] Assignee: Cypress Semiconductor Corp., San Jose, Calif.

[ * ] Notice: The term of this patent shall not extend beyond the expiration date of Pat. No. 5,786,710.

[21] Appl. No.: 967,435

[22] Filed: Nov. 11, 1997

Related U.S. Application Data

[63] Continuation of Ser. No. 580,855, Dec. 29, 1995, abandoned.

[51] Int. Cl.⁶ .............................................. H03K 19/177
[52] U.S. Cl. ................... 326/40; 326/41; 326/46
[58] Field of Search ........................... 326/37–41, 46–47; 365/219

[56] References Cited

U.S. PATENT DOCUMENTS

| | | | |
|---|---|---|---|
| 4,750,149 | 6/1988 | Miller | 364/900 |
| 4,758,746 | 7/1988 | Birkner et al. | 326/38 |
| 4,942,318 | 7/1990 | Kawana | 326/37 |
| 4,963,770 | 10/1990 | Keida | 326/40 |
| 5,023,484 | 6/1991 | Pathak et al. | 326/40 |
| 5,027,011 | 6/1991 | Steele | 326/40 |
| 5,175,819 | 12/1992 | Le Ngoc et al. | 395/250 |
| 5,185,706 | 2/1993 | Agrawal et al. | 364/489 |
| 5,220,213 | 6/1993 | Chan et al. | 326/40 |
| 5,231,588 | 7/1993 | Agrawal et al. | 364/489 |
| 5,282,164 | 1/1994 | Kawana | 326/39 |
| 5,329,460 | 7/1994 | Agrawal et al. | 326/39 |
| 5,426,378 | 6/1995 | Ong | 326/39 |

*Primary Examiner*—Jon Santamauro
*Attorney, Agent, or Firm*—Blakely, Sokoloff Taylor & Zafman LLP

[57] ABSTRACT

A programmable I/O cell with a multiplicity of configurations and data conversion options implemented through the use of antifuses. Increased logic utilization and reduced number of components necessary to implement such designs by using the registers in the I/O cell to implement data conversion functions thereby saving the logic and registers of the FPGA logic cells for implementation of other functions is achieved. Serial-to-parallel and parallel-to-serial data conversion operations utilize adjacent registers in adjacent cells to perform shift operations.

36 Claims, 3 Drawing Sheets

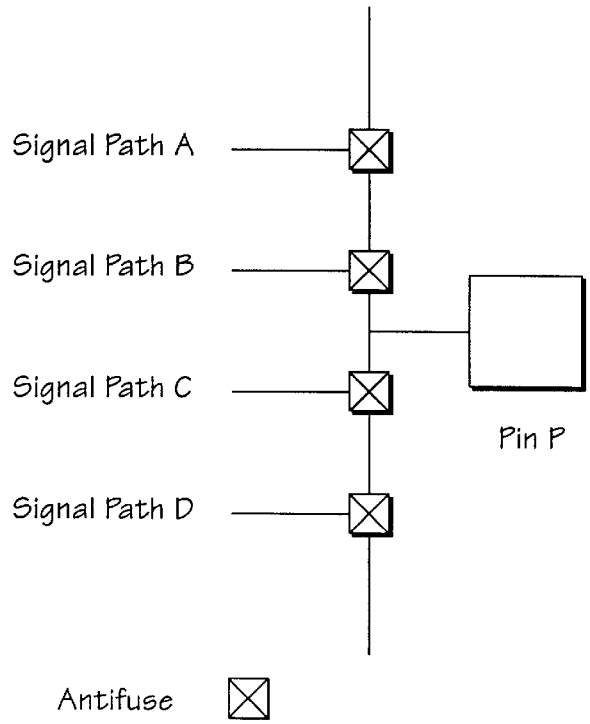
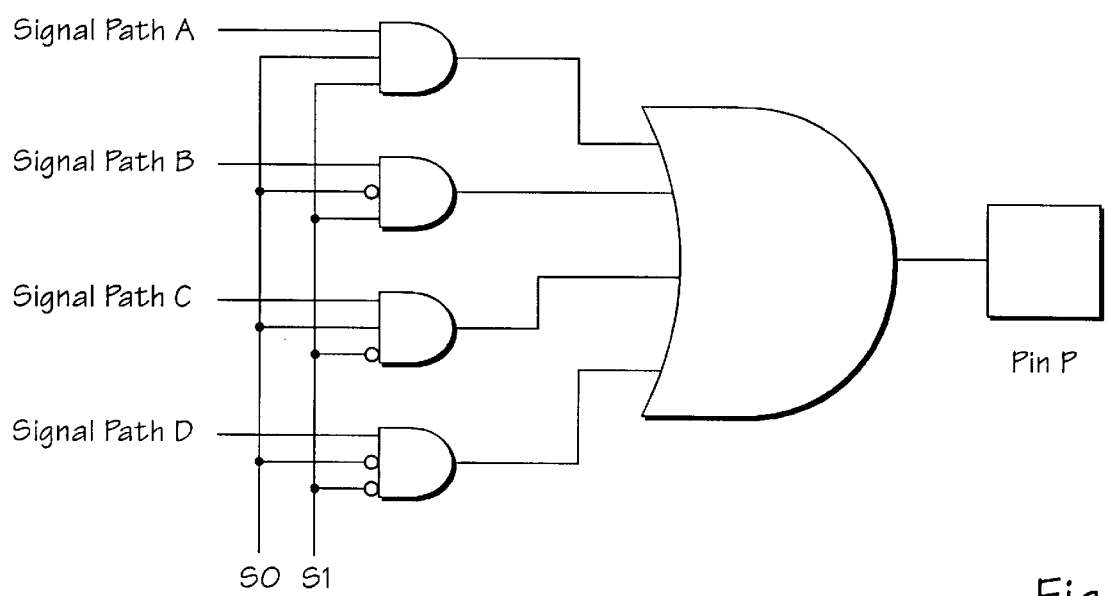
Fig. 1
Fig. 2

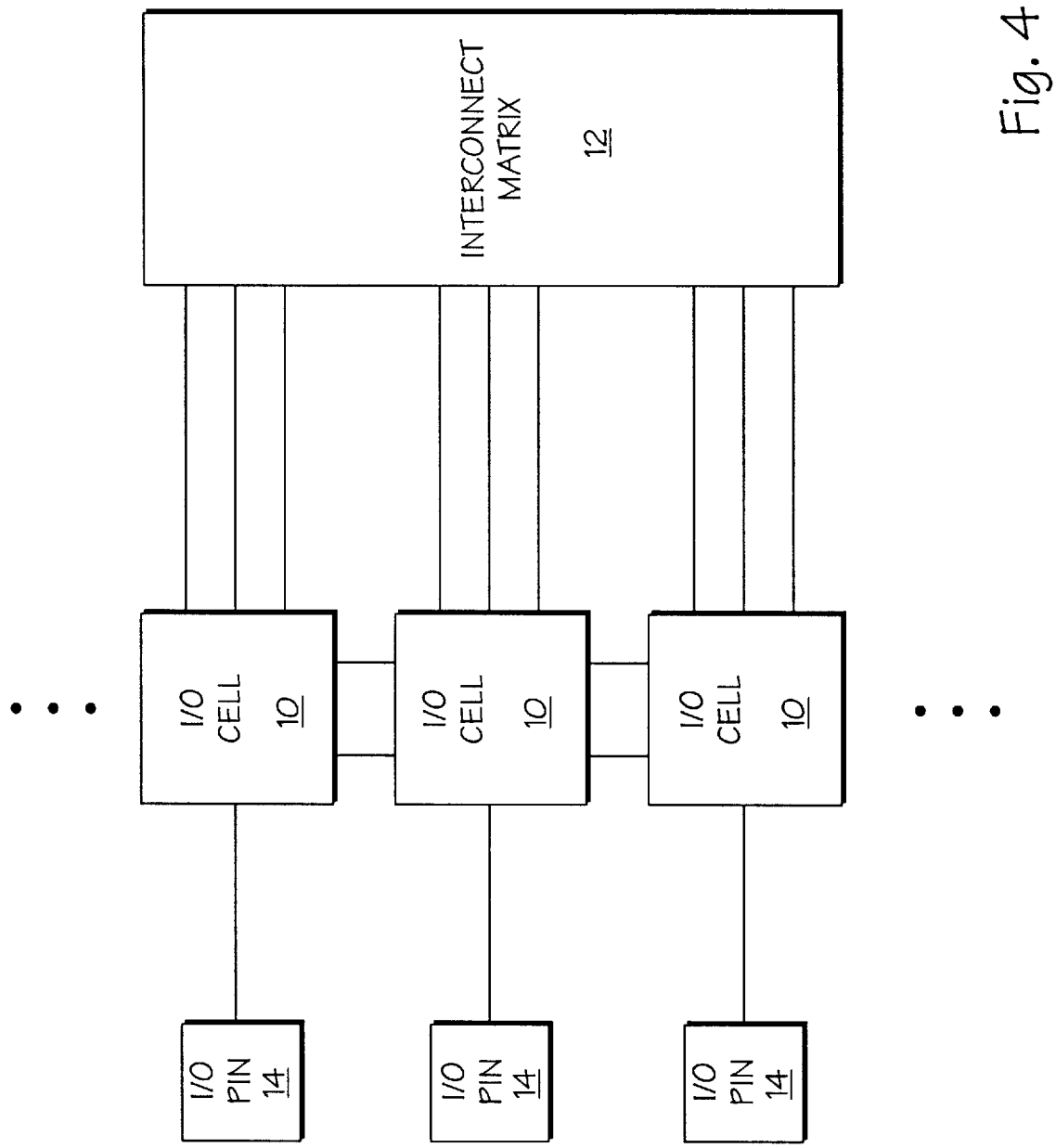

PROGRAMMABLE I/O CELL WITH DATA CONVERSION CAPABILITY

This is a continuation of application Ser. No. 08/580,855, filed Dec. 29. 1995, now abandoned.

CROSS-REFERENCE TO RELATED APPLICATIONS

This Application is related to the following Applications for United States Letters Patent, each of which are assigned to the Assignee of the present invention:

1. Application Ser. No. 08/581,105, filed Dec. 29, 1995 entitled, "Programmable I/O Cell With Data Conversion Capability".
2. Application Ser. No. 08/580,836, filed Dec. 29, 1995 entitled, "Programmable I/O Cell With Data Conversion Capability".
3. Application Ser. No. 08/578,201, filed Dec. 29, 1995 entitled, "Programmable I/O Cell With Data Conversion Capability".
4. Application Ser. No. 08/580,770, filed Dec. 29, 1995 entitled, "Programmable I/O Cell With Data Conversion Capability".

BACKGROUND

Field of the Invention

The area of the present invention relates generally to programmable logic devices and, more particularly, to programmable logic devices having a data conversion capability.

Background Art

In data communication and telecommunication applications the need to convert data from parallel data words to a serial data stream or from a serial data stream to parallel data is a frequent requirement. In CPLDs and FPGAs used in these applications this conversion is accomplished by use of logic block or logic cell register resources. When FPGA logic cell registers, or CPLD macro cell registers, are used strictly as shift register stages, the logic associated with the registers so employed is typically wasted.

Occasionally, a small amount of RAM (a few bytes) is needed in a design implemented in an FPGA or CPLD. In other than Look-Up-Table RAM based FPGAs, precious logic cell registers or CPLD macro cell registers may be used to implement this RAM. Typically, the logic resources associated with these registers is, again, wasted, The result of using the registers of FPGA logic cells or CPLD macrocells to create the structures required to perform serial-to-parallel and parallel-to-serial data conversion is inefficient use of the limited register resources. This very low logic efficiency means that a greater number of components is required and greater board area than would otherwise be necessary is used.

SUMMARY OF THE INVENTION

According to one embodiment of the present invention, by providing minimal additional circuitry and programmable elements to the I/O cells of a programmable logic device, the serial-to-parallel and parallel-to-serial data conversion typically required in data communication and telecommunication applications can take place in the I/O cells, leaving the bulk of internal resources available to implement other logic functions. The features of the I/O cell allow for a multiplicity of configurations and data conversion options which would otherwise require use of additional registers in the logic cells of prior FPGA architectures.

In one configuration, a preferred embodiment of the present invention allows for the conversion of a serial input data stream to a parallel data word. A first bit of the serial data stream is registered in a first register of a first input/output cell of a programmable logic device. The first bit is transmitted to and registered in a second register in a second input/output cell of the device while a second bit of the serial data stream is registered in the first register. The first bit and the second bit are transmitted out of the second register and the first register, respectively, in parallel into a programmable interconnect matrix such that the first bit and the second bit comprise a parallel data word.

In a second configuration, a preferred embodiment of the present invention allows for converting a serial output data stream to a parallel output data word. A first bit of the serial output data stream is registered in a first register of a first input/output cell of a programmable logic device. The first bit is transmitted to and registered in a second register in a second input/output cell of the device while a second bit of the serial output data stream is registered in the first register. The first bit and the second bit are transmitted from the second register and the first register, respectively, in parallel to two output pins of the device, such that the first bit and the second bit comprise a parallel data word at the two output pins.

Additional configurations of a preferred embodiment allow other data conversion schemes which find applications in data communications, telecommunications and other fields.

BRIEF DESCRIPTION OF THE DRAWINGS

The present invention is illustrated by way of example and not limitation in the figures of the accompanying drawings in which:

FIG. 1 illustrates antifuse programmed selection of one of four possible data paths.

FIG. 2 illustrates multiplexer-based selection of one of several possible data paths.

FIG. 4 shows an embodiment of a Programable Logic Device according to the present invention.

DETAILED DESCRIPTION

Figure 3:
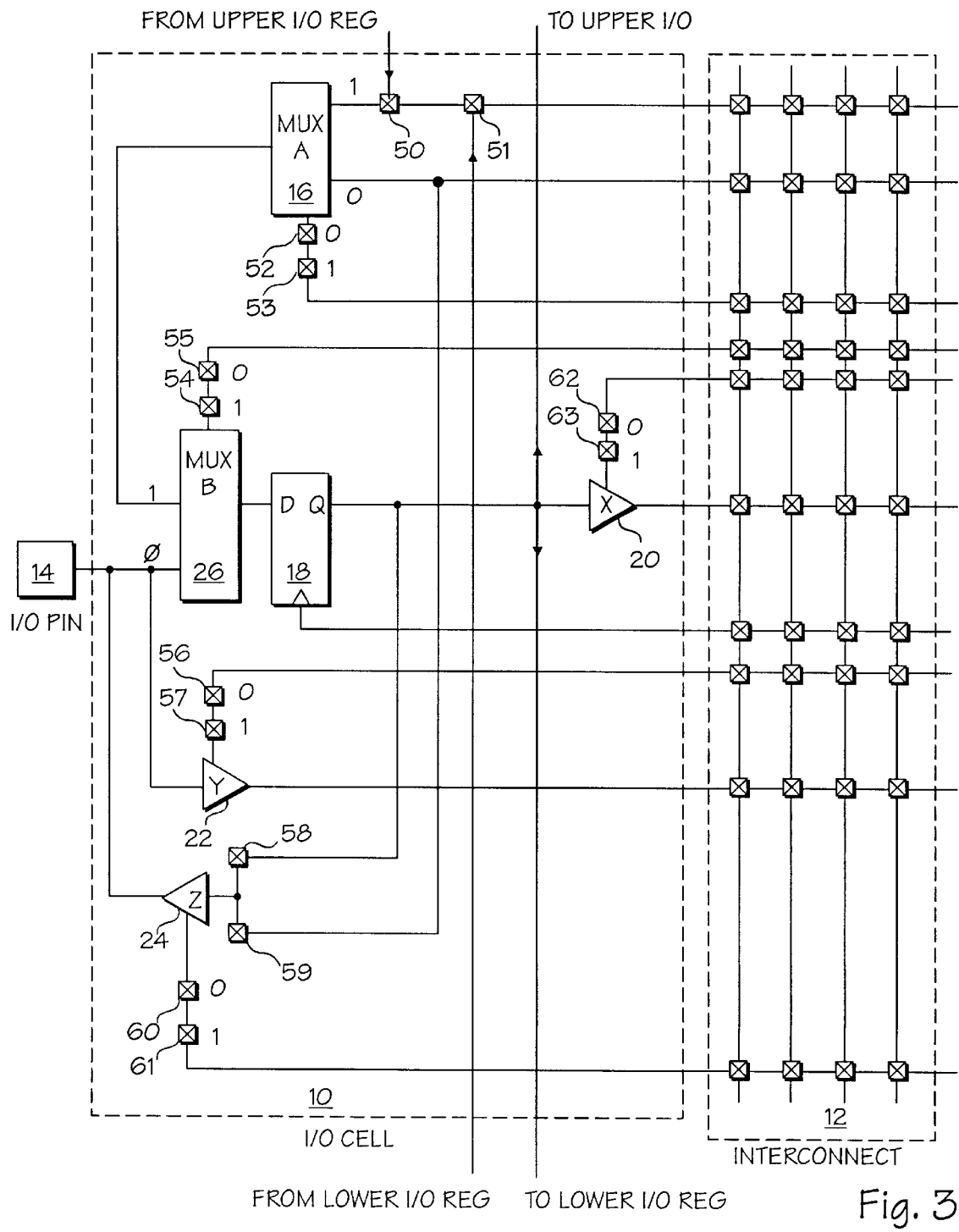
FIG. 3 shows one embodiment of the programmable I/O cell of the present invention.

Referring to the drawings in detail, the following description sets forth numerous specific details in order to provide a thorough understanding of the present invention. However, after reviewing this specification, it will be apparent to those skilled in the art that the present invention may be practiced without these specific details. In other instances, well known structures, techniques and devices have not been described in detail in order to not unnecessarily obscure the present invention.

An I/O cell for an antifuse based FPGA is described. Antifuses are very small, low capacitance programmable elements which are "open" or non-conducting in the virgin (unprogrammed) state but can be programmed by the passage of electric current to form a very low resistance, low capacitance connection. These antifuses can be very useful in the configuration of signal path options in the in the logic blocks and I/O blocks of FPGAs and CPLDs. Although the present description is provided with reference to antifuses, upon review of the specification others skilled in the art will realize that similar implementations could be made using other programmable devices such as EEPROMs and the like. It will be appreciated that the use of such devices is within the scope of the present invention.

FIG. 1 shows antifuse-based programmed selection of one of four possible signal paths, one of which may be selected by programming of the appropriate antifuse to be coupled to pin P. The same options selectable by a multiplexer, as is common in RAM-based FPGAs and non-volatile EEPROM and EPROM based CPLDs, is shown in FIG. 2. The multiplexer selection scheme is more complex and is slower than the simpler antifuse selection scheme of FIG. 1. Of course, the design software making the selection of the signal source in the antifuse scheme of FIG. 1 must exclude the possibility that two antifuses would be programmed in any given configuration, as this would result in signal contention.

The further benefit of the antifuse scheme of FIG. 1 is that many signal selection options can be offered with little increase in signal delay because for each new option only the capacitive loading (typically less than 1 $_p$F per antifuse) of the additional unprogrammed antifuse affects the signal delay for the signal path for which the antifuse is programmed.

Because of the small size of the antifuse element relative to the transistors necessary to implement a multiplexer, the selection structure can be implemented in a much smaller silicon area. As the number of signal sources increases, the savings relative to a multiplexer implementation increases.

The ability of antifuses to implement, efficiently and with minimal signal delay, many signal path selection options in a programmable logic block or an I/O block of an FPGA or CPLD means that a greater number of configuration options can be implemented with minimal increase in signal delay and in less silicon area than that required for multiplexer based selection means.

A Flexible Antifuse Based FPGA Input/Output (I/O) Cell

As discussed above, in data communication and telecommunication applications the need to convert data from parallel data words to a serial data stream or from a serial data stream to parallel data is a frequent requirement. This conversion requires many FPGA logic cell registers to be used strictly as shift register stages and usually wastes the logic of the logic cell whose registers are so employed. The following describes an antifuse configured FPGA I/O cell 10 which, in addition to performing conventional I/O, can also implement parallel-to-serial and serial-to-parallel data conversion on-the-fly, as is frequently required in datacom and telecom applications. This approach frees up the registers in the logic cells and avoids wasting of the logic in the logic cells as often results when these conversion functions are implemented in existing FPGAs.

The FPGA I/O cell 10 is shown in FIG. 3. Several of the novel configurations possible with this I/O cell are described below with the listing of the programmed antifuses necessary to implement the configuration. Those skilled in the art will, upon review of the details of this specification, recognize that other configurations can be achieved and implemented for other applications. The following configurations are therefore presented by way of example and not limitation.

Three state buffer X 20 in FIG. 3 isolates the output of the register 18 from the internal interconnect 12 when serial data is shifted into a shift register composed of I/O registers 18 for parallel transfer to the internal interconnect 12. Three state buffer Y 22 is provided to isolate the input path to interconnect 12 from the I/O pin 14 when pin 14 is being driven as an output in a bi-directional operating mode. The I/O cell 10 of FIG. 3 uses a single register 18 which can be configured as an input register or an output register. The register 18 can also be configured as a buried register or as an input stage, output stage or buried stage of a serial shift register.

Internal interconnect 12 is shown with only four columns. Those skilled in the art will recognize that this is for convenience only and that interconnect 12 may comprise any number of rows and columns necessary to implement a desired configuration.

Configuration A'1:

The single register 18 can be configured to be used as an output register for the I/O cell 10. In such a case, the antifuses programmed are 52, 54, 58 and 61. In this configuration, data is transmitted through the "0" path of MUX A 16 and the "1" path of MUX B 26 from the interconnect 12 and registered in register 18. The data is then transmitted out of register 18 through buffer Z 24 to I/O pin 14.

Configuration A'2:

The single register 18 can be configured to be used as an input register for the I/O cell 10. In such a case, the antifuses programmed are 55, 60 and 63. In this configuration, data is received at I/O pin 14, transmitted through the "0" path of MUX B 26 and registered into register 18. The data is transmitted out of register 18 and through buffer X 20 into interconnect 12.

Configuration A'3:

The register 18 can be configured to be used as a buried register when not required for I/O. In this configuration, the I/O cell 10 is used as a direct input. To achieve this configuration, antifuses 52, 54, 57 and 63 are programmed. In use, data can be stored in register 18 by transmitting the data through the "0" path of MUX A 16 and the "1" path of MUX B 26 from interconnect 12. The data is then transmitted out of register 18 and through buffer X 20 back into interconnection 12. At the same time, input data received at I/O pin 14 is transmitted through Y buffer 22 directly into the interconnect 12. It will be appreciated that register 18 can still function as a buried register even if I/O cell 10 is not configured for direct input.

Configuration A'4:

The register 18 can be configured to be used as a buried register when not required for I/O. In this configuration, the I/O cell 10 is used as a direct output. To achieve this configuration, antifuses 53, 54, 59, 61 and 63 are programmed. Buried register operation achieved by transmitting data from interconnect 12 through the "1" path of MUX A 16 and the "1" path of MUX B 26 to register 18. Data is transmitted out of register 18 through buffer X 20, back to interconnect 12. For direct output, data from interconnect 12 passes through buffer Z 24 to I/O pin 14.

Configuration A'5:

The register 18 can be configured to be used as a buried register when not required for I/O. In this configuration, the I/O cell 10 is used for bi-directional direct input/output. The antifuses programmed in this configuration are 53, 54, 59 and 63. Buried register operation is as for Configuration A'4. Logic control via the internal interconnect 12 is implemented for three state input buffer Y 22 and three state output buffer Z 24. By alternate activation of buffer Y 22 and buffer Z 24, bi-directional direct input/output from/to I/O pin 14 is achieved.

Configuration A'6:

The I/O cell register 18 can be configured to be used as the input stage of a serial input shift register implemented using multiple I/O cell registers 18 linked together. This configuration is achieved by programming antifuses 55, 60 and 62. In this configuration, data received on I/O pin 14 is transmitted through the "0" path of MUX B 26 and registered in register 18. The data is transmitted out to and registered in a second register, either in an adjacent cell via a direct path coupling or in a non-adjacent cell via an interconnect coupling. Buffers X 20 and Z 24 are disabled to prevent undesired signal transmission. FIG. 4 illlustrates an embodiment of a PLD according to the present invention in which adjacent I/O cells 10 are connected. Each I/O cell 10 is further connected to an I/O pin 14 as well as the programmable interconnect matrix 12.

Configuration A'7:

The I/O cell register 18 can be configured to be used as an intermediate stage of a serial input, serial output or buried serial shift register implemented using multiple I/O cell registers 18 linked together. In this configuration I/O cell 10 is used for direct input and antifuses 50 or 51, 53, 54, 57 and 62 are programmed. It will be appreciated that in this configuration, data is received from an adjacent cell register and passed to register 18 via the "1" data path of MUX A 16 and the "1" path of MUX B 26. By activating input buffer Y 22 via programming of antifuse 57, the cell 10 can still act as a direct input with data being received at input pad 14 and transmitted to the interconnect 12.

Configuration A'8:

The register 18 can be configured to be used as an intermediate stage of a serial input, serial output or buried serial shift register implemented using multiple I/O cell registers 18 linked together. The I/O cell 10 is used for direct output in this configuration and antifuses 50 or 51, 53, 54, 59, 61 and 62 are programmed. This is similar to configuration A'7, however, direct output data is passed from the interconnect 12 through buffer Z 24 to I/O pin 14. It will be appreciated that in this configuration, data is received from an adjacent cell register and passed to register 18 via the "1" data path of MUX A 16 and the "1" path of MUX B 26.

Configuration A'9:

The I/O cell register 18 can be configured to be used as an intermediate stage of a serial input, serial output or buried serial shift register implemented using multiple I/O cell registers 18 linked together. In this configuration, I/O cell 10 is used for bidirectional direct input/output. Antifuses 50 or 51, 53, 54, 59, and 62 are programmed. Register operation is as for Configuration A'7. Logic control via the internal interconnect 12 is implemented for three state input buffer Y 22 and three state output buffer Z 24. By alternate activation of buffer Y 22 and buffer Z 24, bi-directional direct input/output from/to I/O pin 14 is achieved. It will be appreciated that in this configuration, data is received from an adjacent cell register and passed to register 18 via the "1" data path of MUX A 16 and the "1" path of MUX B 26.

Configuration A'10:

The I/O cell register 18 can be configured to be used as the final stage of a serial input shift register implemented using multiple I/O cell registers 18 linked together with the final stage output routed to the internal interconnect 12. For this configuration, the I/O cell 10 is used for direct input. Antifuses 50 or 51, 53, 54, 57 and 63 are programmed. In operation, data is passed from an adjacent register via the "1" data path of MUX A 16 and the "1" path of MUX B 26 and registered in register 18. Data is transmitted out of register 18, through buffer X 20 and into the interconnect 12.

It will be appreciated that each subsequent clock pulse transfers the contents of one register 18 to the next register 18 in the chain. Ultimately, each register's contents are passed to the register 18 in a cell 10 with this configuration (i.e., the last stage of the shift register). Data from this final register 18 is transmitted to the interconnect 12 as described above. Direct input data received on I/O pin 14 is transmitted through input buffer Y 22 to the interconnect 12.

Configuration A'11:

The register 18 can be configured to be used as the final stage of a serial input shift register implemented using multiple I/O cell registers 18 linked together with the final stage output routed to internal interconnect. This time, I/O cell 10 is used for direct output. Antifuses 50 or 51, 53, 54, 59, 61 and 63 are programmed. This is similar to configuration A10, however direct output data from interconnect 12 is transmitted through output buffer Z 24 to I/O pin 14. In operation, data is passed from an adjacent register via the "1" data path of MUX A 16 and the "1" path of MUX B 26 and registered in register 18. Data is transmitted out of register 18, through buffer X 20 and into the interconnect 12. It will be appreciated that each subsequent clock pulse transfers the contents of one register 18 to the next register 18 in the chain. Ultimately, each register's contents are passed to the register 18 in a cell 10 with this configuration (i.e., the last stage of the shift register).

Configuration A'12:

The I/O cell register 18 can be configured to be used as the final stage of a serial input shift register implemented using multiple I/O cell registers 18 linked together with the final stage output routed to internal interconnect 12. Here, I/O cell 10 is used for bi-directional direct input/output. Antifuses 50 or 51, 53, 54, 59 and 63 are programmed. Register operation is as for Configuration A'10. Logic control via the internal interconnect 12 is implemented for three state input buffer Y 22 and three state output buffer Z 24. By alternate activation of buffer Y 22 and buffer Z 24, bidirectional direct input/output from/to pin 14 is achieved. In operation, data is passed from an adjacent register via the "1" data path of MUX A 16 and the "1" path of MUX B 26 and registered in register 18. Data is transmitted out of register 18, through buffer X 20 and into the interconnect 12. It will be appreciated that each subsequent clock pulse transfers the contents of one register 18 to the next register 18 in the chain. Ultimately, each register's contents are passed to the register 18 in a cell 10 with this configuration (i.e., the last stage of the shift register).

Configuration A'13:

The register 18 can be configured to be used as the initial stage of a serial output shift register implemented using multiple I/O cell registers 18 linked together with the final stage output routed to the I/O pin 14. In this configuration, the I/O cell 10 is used for direct input and antifuses 53, 54, 57 and 62 are programmed. In operation, serial data is received from interconnect 12 via the "1" data path of MUX A 16 and the "1" path of MUX B 26 and registered in register 18. Each subsequent clock pulse transfers the contents of register 18 to the next register 18 in the chain. Ultimately, each register's contents are passed to a register 18 in a cell 10 with a configuration such that the data transmitted out of the register 18 is passed to I/O pin 14 (i.e., the cell 10 is the last stage of the shift register). Direct input data received on I/O pin 14 is transmitted through input buffer Y 22 to interconnect 12. It will be appreciated that register 18 can still be configured for this type of operation even if the cell 10 is not configured for direct input operation. In such a configuration, antifuse 56 should be programmed to disable buffer Y 22.

Configuration A'14:

The I/O cell register 18 can be configured to be used as the initial stage of a serial output shift register implemented using multiple I/O cell registers 18 linked together with the final stage output routed to the I/O pin 14. This time, I/O cell 10 is used for direct output. To achieve this configuration, antifuses 53, 54, 59, 61 and 62 are programmed. This is similar to configuration A'13, however, direct output data from interconnect 12 is transmitted through buffer Z 24 to I/O pin 14.

Configuration A'15:

The I/O cell register 18 can be configured to be used as the initial stage of a serial output shift register implemented using multiple I/O cell registers 18 linked together with the final stage output routed to the I/O pin 14. For this configuration, I/O cell 10 is used for bidirectional direct input/output. In this configuration, antifuses 53, 54, 59 and 62 are programmed. Register operation is as for Configuration A'13. Logic control via the internal interconnect 12 is implemented for three state input buffer Y 22 and three state output buffer Z 24. By alternate activation of buffer Y 22 and buffer Z 24, bidirectional direct input/output from/to I/O pin 14 is achieved.

Configuration A'16:

The register 18 can be configured to be used as the final stage of a serial output shift register implemented using multiple I/O cell registers 18 linked together with the final stage output routed to the I/O pin 14. For this configuration, antifuses 50 or 51, 53, 54, 58 and 61 are programmed. In operation, data is received from an adjacent register 18 via data path "1" of MUX A 16 and the "1" path of MUX B 26 and registered in register 18. Data stored in register 18 is transmitted out of register 18 and through output buffer Z 24 to I/O pin 14. After the data output through pin 14 is captured by external logic, subsequent clock pulses applied to each register in the chain transfer each register's contents into the next logically adjacent register. In this fashion, serial output data is passed from register to register until it is finally transmitted to a register 18 in a cell 10 with this configuration (i.e., the last stage of the serial shift register). From this cell 10, the data is output via I/O pin 14 as described above.

Configuration A'17:

The I/O cell register 18 can be configured to be used for bi-directional registered input/direct output I/O. For this configuration, antifuses 55, 56 and 59 are programmed. Data received on I/O pin 14 is transmitted via the "0" path of MUX B 26 and registered in register 18. Logic control via the internal interconnect 12 is implemented for three state input buffer X 20 and three state output buffer Z 24. By alternate activation of buffer X 20 and buffer Z 24, bidirectional registered input/direct output from/to I/O pin 14 is achieved. Logic control of buffer X 20 allows the same interconnect line of interconnect 12 to be used as both the output data path and the input data path.

Configuration A'18:

The register 18 can be configured to be used for bi-directional direct input/registered output I/O. Here, antifuses 52, 54, 58 and 62 are programmed. Data is transmitted from the interconnect 12 through the "0" data path of MUX A 16 and the "1" path of MUX B 26 and registered in register 18. Logic control via the internal interconnect 12 is implemented for three state input buffer Y 22 and three state output buffer Z 24. By alternate activation of buffer Y 22 and buffer Z 24, bi-directional direct input/registered output I/O from/to pin 14 is achieved. Availability of buffers Y 22 and Z 24 allows the same interconnect line of interconnect 12 to be used as both the output data path and the input data path.

Configuration A'19:

The register 18 can be configured to be used for bi-directional direct input/direct output I/O. For this configuration, antifuse 59 is programmed. Logic control via the internal interconnect 12 is implemented for three state input buffer Y 22 and three state output buffer Z 24. By alternate activation of buffer Y 22 and buffer Z 24, bi-directional direct input/direct output I/O from/to pin 14 is achieved. Availability of buffers Y 22 and Z 24 allows the same interconnect line of interconnect 12 to be used as both the output data path and the input data path.

Configuration A'20:

A two stage synchronizer for implementing metastable hardened inputs can be implemented in two adjacent I/O cells of type 10. For the input stage, the antifuses programmed are 55, 56, 60 and 62. Data received on I/O pin 14 is transmitted via the "0" path of MUX B 26 and registered in register 18. The data is then transmitted out to an adjacent second stage. For the second stage, antifuses 50 or 51, 53, 54 and 63 are programmed. Data is received from the register of the first stage via data path "1" of MUX A 16 and data path "1" of MUX B 26 and registered in register 18 of the second stage in the adjacent cell. The data is then transmitted out through buffer X 20 into the interconnect 12.

Configuration A'21:

A word wide input FIFO can be implemented in I/O cells of type 10 by extending configuration A'20 to more than 2 stages and creating such a shift register for each bit of the word. For the input stage, antifuses 55, 56, 60 and 62 are programmed. Register operation is as for Configuration A'6. For the intermediate stage, antifuses 50 or 51, 53, 54 and 62 are programmed. Register operation of this stage is as for Configuration A'7. For the final stage, antifuses 50 or 51, 53, 54 and 63 are programmed. The final stage register operates as for Configuration A'10. All registers comprising the FIFO would normally be clocked by the same signal source, routed from interconnect 12.

The word wide input FIFO can also be configured such that after the FIFO has been loaded by serially shifting in the data words, any word in the FIFO can be transferred in parallel to the internal interconnect 12. This is accomplished by leaving buffer X 20 under logic control in each stage via connection of the buffer X 20 control line to internal interconnect 12 (neither antifuse 62 nor antifuse 63 programmed) and, after a serial load of the FIFO has been completed, enabling selectively the buffer X 20 for the shift register stages representing the data word to be transferred to the internal interconnect 12. By this means, random access for a read of the FIFO locations can be accomplished.

Configuration A'22:

A word wide output FIFO can be implemented in I/O cells of type 10 by creating a serial output shift register for each bit of the word. For the input stage, antifuses 52 and 54 are programmed. Register operation is as per Configuration A'13. For the intermediate stage, antifuses 50 or 51, 53 and 54 are programmed. The register of this stage operates as per Configuration A'7. For the final stage, antifuses 50 or 51, 53, 54, 58 and 61 are programmed. Register operation is as for Configuration A'16.

This word wide output FIFO can be configured such that any word of the FIFO can be written at random and then shifted out of the FIFO. This scheme requires that MUX A 16 control input be under logic control in each FIFO stage via connection of the MUX A 16 select line to internal interconnect 12 (neither antifuse 52 nor antifuse 53 programmed). This allows the input path for the registers representing the data word to be written to be switched from the "1" path, required for serial shifting, to the "0" path, which allows data from the internal interconnect 12 to be loaded in the register. To accomplish this single word write only the clock control for the register stages representing the word to be written should be clocked.

The output FIFO can also be configured such that buffer X 20 is under logic control via connection of the buffer control line to internal interconnect 12 (neither antifuse 62 nor antifuse 63 programmed) for each shift register stage. This allows each bit of the last word of the output FIFO to be to be routed back to the MUX A 16 input path "0" via the interconnect 12 for the same bit of the first word of the FIFO. This allows a circular shift of the contents of the FIFO by clocking all registers 18 comprising the FIFO and by routing through the internal interconnect 12 the corresponding bit of the last word via buffer X 20 back to the "0" input path of MUX A 16 for the corresponding bit of the first word.

In addition, a shuffling of FIFO data words can be accomplished by randomly enabling the X buffer 20 of the data location from which the data word is desired and routing it through the interconnect 12 back to the MUX A 16 "0" input path for the first FIFO stage prior to the clocking of the register 18 of the first stage location only. This shuffling scheme requires that when any word location is transferred to the first word location, the prior content of the first word location of the FIFO first be routed via other interconnects and logic to another storage location so that it is not lost and can be reinserted by selective single word write, as described above in Configuration A'22, to the word location from which the transfer was made to the first word location to initiate the shuffle exchange. By this means an effective exchange of data words can be accomplished.

Dynamic Data Conversion Configurations

Configuration A'D1: Input Serial to Parallel Data Conversion

I/O Cell 10 allows serial input load to parallel input conversion and transfer to the internal interconnect 12 using multiple I/O registers 18 linked together. For the input stage of the serial shift register, antifuses 55 and 60 are programmed. Register operation is as for Configuration A'6. For subsequent stages of the serial shift register, antifuses 50 or 51, 53 and 54 are programmed and register operation is as per Configuration A'7.

For all but the first stage of the serial shift register, the I/O cell 10 can simultaneously be configured for one of the following functions: For direct input, antifuse 57 is programmed. For direct output, antifuses 59 and 61 are programmed. For bidirectional input/output, antifuse 59 is programmed with logic control implemented for input three state buffer Y 22 and output three state buffer Z 24 via connection of the respective buffer control lines to internal interconnect 12 (none of antifuses 56, 57, 60 or 61 programmed). In this bi-directional mode, alternate activation of buffer Y 22 and buffer Z 24 allows for bi-directional direct input/direct output I/O.

For the serial load operation, all "W" stage I/O registers 18 are clocked in unison "W" times for a "W" stage shift register implemented in "W" adjacent I/O registers 18. Input data is applied to the first stage input and buffer X 20 is disabled in each stage under logic control via connection of the buffer control line to internal interconnect 12 (neither antifuse 62 nor 63 programmed) to isolate the internal interconnect 12 and logic destination from toggling of register 18 outputs during serial shift in.

For the parallel input transfer operation, the clock is held and buffer X 20 is enabled in each serial shift register stage to transfer the "W" bit length word in parallel into the internal interconnect 12.

Configuration A'D2: Internal Serial to Parallel Data Conversion

Cell 10 allows internal serial load from the internal interconnect 12 to parallel input conversion and transfer back to internal interconnect 12 using multiple I/O registers 18 linked together. To accomplish this configuration, in the first stage antifuses 53 and 54 are programmed. Register operation is as for Configuration A'14 In subsequent stages, antifuses 50 or 51, 53 and 54 are programmed. and register operation is as per Configuration A'7.

For any of the stages of the shift register, the I/O cell 10 can simultaneously be configured for one of the following functions: For direct input, antifuse 57 is programmed. For direct output, antifuses 59 and 61 are programmed. For bi-directional input/output, antifuse 59 is programmed with logic control implemented for input three state buffer Y 22 and output three state buffer Z 24 via connection of the respective buffer control lines to interconnect 12 (none of antifuses 56, 57, 60 or 61 programmed). In this bidirectional mode, by alternate activation of buffer Y 22 and buffer Z 24, bi-directional direct input/direct output I/O is achieved.

For this configuration, a serial load operation is achieved as follows: All "W" stage I/O registers 18 are clocked in unison "W" times for a "W" stage shift register implemented in "W" adjacent I/O registers 18. Input data is received from the internal interconnect 12 and transmitted via the "1" path of MUX A 16 and the "1" path of MUX B 26 to register 18. Buffer X 20 is disabled in each stage under logic control via connection of the buffer control line to the internal interconnect 12 (neither antifuse 62 nor 63 programmed) to isolate the internal interconnect 12 and internal logic destination from toggling of register 18 outputs during serial shift.

Parallel input transfer operation proceeds with the clock being held and buffer X 20 enabled in each serial shift register stage to transfer the "W" bit length word in parallel into the internal interconnect 12.

Configuration A'D3: Serial Output Data to Parallel Output Data Conversion:

Cell 10 allows a serial output data stream to be converted to a parallel output data word using multiple adjacent output configured I/O registers 18 linked together. For such a configuration, the first stage has antifuses 53, 54, 56, 58 and 62 programmed. Register operation is as for Configuration A'1. The intermediate and final stages have antifuses 50 or 51, 53, 54, 56, 58 and 62 programmed and register operation is as per Configuration A'7.

In this configuration, a serial load is accomplished as follows: All "W" stage I/O registers 18 are clocked in unison "W" times for a "W" stage shift register implemented in "W" adjacent I/O registers. Input data is received from the internal interconnect 12 and transmitted the "1" data paths of MUX A 16 and MUX B 26 to register 18. Buffer X 20 is permanently disabled in each stage by the programming of antifuse 62 to isolate the path to internal interconnect 12 and to minimize noise generated from toggling of register 18 outputs during serial shift. Buffer Z 24 in each stage is operated under logic control via connection of the buffer control line to internal interconnect 12 (neither antifuse 60 or 61 programmed). During serial shift, buffer Z 24 is disabled in each stage to prevent I/O pins 14 from toggling during the serial load.

The parallel output transfer operation is accomplished by holding the clock and enabling buffer Z 24 in each serial shift register stage to transfer the "W" bit length word in parallel to the I/O pins 14.

Configuration A'D4: Demultiplexing of Internal Serial Data by Combination of Configurations A'D2 and A'D3:

By using configuration A'D3 with antifuse 62 unprogrammed in each I/O cell 10 which constitutes a stage of the serial output shift register, a serial output data stream can be loaded into the shift register. Then, by enabling either buffer Z 24 or buffer X 20 under logic control via connection of the respective buffer control lines to interconnect 12, data can be transferred to output pins 14 and/or the internal interconnect 12 respectively. Once the serial shift register has been loaded, these two buffers can be selectively enabled in different stages of the serial register to decompose the serial data into two different parallel data fragments, one fragment transferred in parallel to the internal interconnect 12 and one fragment transferred in parallel to the I/O pins 14.

To accomplish this configuration, the first stage has antifuses 53, 54, 56 and 58 programmed. The intermediate stages have antifuses 50 or 51, 53, 54, 56 and 58 programmed. The final stage has antifuses 50 or 51, 53, 54, 56 and 58 programmed.

In this configuration, a serial load operation is completed as follows: All "W" stage I/O registers 18 are clocked in unison "W" times for a "W" stage shift register implemented in "W" adjacent I/O registers 18. Input data is received from the internal interconnect 12 and routed via the "1" data paths of MUX A 16 and MUX B 26 to register 18. Buffer X 20 is disabled under logic control in each stage via connection of the buffer control line to interconnect 12 (antifuses 62 and 63 unprogrammed) to isolate the internal interconnect 12 and internal logic destination from toggling of register 18 outputs during serial shift. Buffer Z 24 in each stage is operated under logic control via connection of the buffer control line to internal interconnect 12 (neither antifuse 60 or 61 programmed). During serial shift, buffer Z 24 is disabled in each stage to prevent I/O pins 14 from toggling during the serial load.

Once the serial shift register is loaded, the parallel output transfer operation is as follows: Clock is held and buffer Z 24 is enabled in all, or a subset of, the serial shift register stages to transfer the "W" bit length word, or some fragment thereof, in parallel to the I/O pins 14.

Once the serial shift register is loaded, the parallel input transfer operation is accomplished by holding the clock and enabling buffer X 20 in all, or a subset of, the serial shift register stages to transfer the "W" bit length word, or some fragment thereof, in parallel into the internal interconnect 12.

Bi-directional output registered/direct input I/O is possible on each pin 14 associated with each cell 10 of the shift register by leaving antifuse 56 unprogrammed and alternately enabling buffer Y 22 and buffer Z 24 under logic control via connection of the respective buffer control lines to interconnect 12 to implement bi-directional I/O.

Configuration A'D5: Parallel Output Data Conversion to Serial Out Data Stream:

Cell 10 allows a parallel output word conversion to a serial output data stream using multiple adjacent output configured I/O cells 10 linked together. In this configuration, the initial stage has antifuses 54 and 62 programmed. The intermediate stages have antifuses 50 or 51, 54 and 62 programmed. The output stage has antifuses 50 or 51, 54, 58, 61 and 62 programmed.

The parallel load operation proceeds as follows: All MUX A 16 control lines are driven LOW or to "0" via the internal interconnect 12 signals. A single clock pulse on all I/O register 18 clock inputs loads all I/O registers 18 in parallel from the internal interconnect 12 via the "0" data path of MUX A 16 and the "1" data path of MUX B 26.

Next, the serial shift out operation proceeds as follows: All MUX A 16 control lines are driven HIGH or to "1" via internal interconnect 12 signals to establish the serial link between shift register stages. A sequence of "W" clock pulses is applied in unison to all "W" I/O cells 10 making up the shift register to shift the "W" bits of serial data from the shift register I/O pin 14 in the last shift register stage. Shifting through the intermediate stages is via the "1" data paths of MUX A 16 and MUX B 26.

Direct input can be implemented in all I/O cells 10 composing the shift register except for the last stage which drives the I/O pin 14 to deliver the serial output data stream. For this direct input path, antifuse 57 is programmed.

Configuration A'D6: I/O Registers Used as a Buried Register File #1:

Any set of I/O registers 18 configured as buried registers can used to create an internal register file of any organization. Here the "RAM cell" has antifuses 52 and 54 programmed. The cell can be written from the internal interconnect 12 and read from either the interconnect 12 or the I/O pin 14.

Write operations occur as follows: Data to be written is applied to the "0" input of MUX A 16 for the cells 10 comprising the word to be written. Each register 18 of the desired word is clocked and data is written from the internal data bus to the I/O registers 18.

Read operations occur as follows: To read the content back to the internal interconnect 12 data bus, the buffer X 20 for the appropriate word is enabled to read the stored data back onto the internal interconnect 12 data bus. Care is required to insure that the data drivers which wrote to the I/O registers 18 have released the internal interconnect 12 bus before the buffer X 20 is enabled. Any number of words may share the internal interconnect 12 data bus as long as the buffer X 20 enable signals are properly decoded to enable only one word for read back at any one time.

The output pins can be used to inspect any stored word in the register file by programming antifuse 58 and using the buffer Z 24 to enable the stored value to be read at the I/O pin 14. The same decoding scheme used to decode the enabling of buffer X 20 for internal read back can be used to enable the buffer Z 24 for I/O pin 14 read out. The output pins can be connected in parallel to form the same width output bus as is implemented in the internal interconnect 12. Alternatively, the width of the data word read out at the I/O pins 14 may be different than the word width written to the buried register file. This is accomplished by using different address decoding logic to enable the buffer Z 24 for output. For example, the write operation might be for byte wide data and the read operation for 16 bit words or even 4 bit wide "nibbles".

Configuration A'D7: I/O Registers Used as a Buried Register File #2:

Any set of I/O registers 18 configured as buried registers can used to create an internal register file of any organization. In this configuration, the "RAM" can be written from the internal interconnect 12 and from the I/O pins 14 and read from the internal interconnect 12 and from the I/O pins 14. The "RAM cell" has antifuse 52 programmed.

Write operations occur as follows: Data to be written is applied to the "0" input of MUX A 16 for the cells 10 comprising the word to be written. MUX B 26 is set under logic control to the "1". input path. Each register 18 of the desired word is clocked and data is written from the internal data bus to the I/O registers 18.

Data can be written to the register 18 from the I/O pins 14 as well. MUX B 26 is set to the "0" input path under logic control via connection of the MUX B 26 select line to internal interconnect 12. Each register 18 of the desired word is clocked and data is written from the I/O pins 14 to the I/O registers 18.

Read operations occur as follows: To read the content back to the internal interconnect 12 data bus, the buffer X 20 for the appropriate word is enabled to read the stored data back onto the internal interconnect 12 data bus. Care is required to insure that the data drivers which wrote to the I/O registers 18 have released the internal interconnect bus before the buffer X 20 is enabled. Any number of words may share the internal interconnect data bus as long as the buffer X 20 enable signals are properly decoded to enable only one word for read back at any one time.

The output pins can be used to inspect any stored word in the register file by programming antifuse 58 and using the buffer Z 24 to enable the stored value to be read at the I/O pin 14. The same decoding scheme used to decode the enabling of buffer X 20 for internal read back can be used to enable the buffer Z 24 for I/O pin 14 read out. The output pins can be connected in parallel to form the same width output bus as is implemented in the internal interconnect 12. Alternatively, the width of the data word read out at the I/O pins 14 may be different than the word width written to the buried register file. This is accomplished by using different address decoding logic to enable the buffer Z 24 for output. For example, the write operation might be for byte wide data and the read operation for 16 bit words or even 4 bit wide "nibbles".

Configuration A'D8: Parallel Data Input to Serial Data Shift In:

I/O cell 10 allows parallel input to be converted to serial data and shifted in. In this configuration, the initial shift register stage has antifuses 52, 56, 60 and 62 programmed. The intermediate stages have antifuses 50 or 51, 53, 56, 60 and 62 programmed. The last stage has antifuses 50 or 51, 53, 56,60 and 63 programmed.

A parallel load is accomplished as follows: The MUX B 26 control input is driven LOW or to "0" under logic control. A single clock pulse is applied to all stages to load data from each I/O pin 14 into each I/O register 18 stage in parallel.

A serial shift in is then accomplished as follows: The MUX B 26 control input is driven HIGH or to a "1" under logic control to engage the serial shift path between register stages. A sequence of "W" clock pulses is applied in unison to all of "W" stage registers 18 comprising the shift register to serially shift data from "W" stages into the internal interconnect 12.

Thus, a novel programmable I/O cell with data conversion capability has been described. Although the teachings have been presented in connection with a particular circuit embodiment, it should be understood that the methods of the present invention are equally applicable to a number of systems. Therefore, the disclosure should be construed as being exemplary and not limiting and the scope of the invention should be measured only in terms of the appended claims.

What is claimed is:

1. A programmable logic device comprising:
    a programmable interconnect matrix;
    a first input/output cell with a first register having an input and an output, the input of the first register adaptable to be coupled to a first input/output pad, the programmable interconnect matrix or either of a pair of adjacent input/output cells through dedicated signal paths separate from the programmable interconnect matrix; and
    a second input/output cell with a second register having an input and an output, the input of the second register adaptable to be coupled to a second input/output pad, the output of the second register coupled to a first of said dedicated signal paths.

2. A programmable logic device as in claim 1 further comprising:
    a third input/output cell with a third register having an input and an output, the input of the third register adaptable to be coupled to a third input/output pad, the output of the third register coupled to a second of said dedicated signal paths.

3. A programmable logic device as in claim 1, wherein the output of the second register is adaptable to be coupled to the programmable interconnect matrix.

4. A programmable logic device as in claim 3 wherein the output of the first register is adaptable to be coupled to the input of the second register via the programmable interconnect matrix.

5. A programmable logic device as in claim 2 wherein the output of the second register is adaptable to be coupled to the programmable interconnect matrix and the output of the third register is adaptable to be coupled to the programmable interconnect matrix.

6. A programmable logic device as in claim 5 wherein the output of the first register is adaptable to be coupled to the input of the second register via the programmable interconnect matrix.

7. A programmable logic device as in claim 6 wherein the output of the second register is adaptable to be coupled to the input of the third register via the programmable interconnect matrix.

8. A programmable logic device as in claim 1 further comprising:
    a first buffer having an input coupled to the output of the first register and having output adaptable to be coupled to the programmable interconnect matrix; and a second buffer having an input coupled to the output of the second register, and having an output adaptable to be coupled to the programmable interconnect matrix.

9. A programmable logic device as in claim 8 wherein the input of the second register is further adaptable to be coupled to the programmable interconnect matrix.

10. A programmable logic device as in claim 9 wherein the output of the second register is further adaptable to be coupled to the second input/output pad.

11. A programmable logic device as in claim 10 wherein the output of the first register is further adaptable to be coupled to the first input/output pad.

12. A programmable logic device as in claim 11 wherein the output of the second register is further adaptable to be coupled to the input of the first register via the programmable interconnect matrix.

13. A programmable logic device as in claim 12 wherein the first input/output pad is further adaptable to be coupled to the programmable interconnect matrix.

14. A programmable logic device as in claim 13 wherein the second input/output pad is further adaptable to be coupled to the programmable interconnect matrix.

15. A programmable logic device comprising:
    a programmable interconnect matrix;
    a first input/output cell with a first register having an input and an output, the output of the first register adaptable to be coupled to a first input/output pad and coupled to a dedicated signal path to two adjacent input/output cells separate from the programmable interconnect matrix; and
    a second input/output cell with a second register having an input and an output, the output of the second register adaptable to be coupled to a second input/output pad and the input of the second register adaptable to be coupled to the dedicated signal path.

16. A programmable logic device as in claim 15 comprising a third input/output cell with a third register having an input and an output, the output of the third register adaptable to be coupled to a third input/output pad, and input of the third register adaptable to be coupled to the dedicated signal path.

17. A programmable logic device as in claim 15 wherein the input of the first register is adaptable to be coupled to the programmable interconnect matrix.

18. A programmable logic device as in claim 17 wherein the output of the first register is adaptable to be coupled to the input of the second register via the programmable interconnect matrix.

19. A programmable logic device as in claim 16 wherein the input of the first register is adaptable to be coupled to the programmable interconnect matrix.

20. A programmable logic device as in claim 19 wherein the output of the first register is adaptable to be coupled to the input of the second register via the programmable interconnect matrix.

21. A programmable logic device as in claim 20 where in the output of the second register is adaptable to be coupled to the input of the third register via the programmable interconnect matrix.

22. A programmable logic device as in claim 19 wherein the output of the second register is adaptable to be coupled to the input of the third register via the programmable interconnect matrix.

23. A programmable logic device as in claim 17 wherein the input of the second register is further adaptable to be coupled to the programmable interconnect matrix.

24. A programmable logic device as in claim 23 wherein the input of the second register is further adaptable to be coupled to the second input/output pad.

25. A programmable logic device as in claim 24 wherein the input of the first register is further adaptable to be coupled to the first input/output pad.

26. A programmable input/output cell for a programmable logic device having a programmable interconnect matrix, the programmable input/output cell comprising:
   an input/output pad;
   a register having output adaptable to be coupled to the input/output pad and coupled to a dedicated signal path to two adjacent input/output cells separate from the programmable interconnect matrix, and further having an input;
   a first buffer having an input adaptable to be coupled to the programmable interconnect matrix through a signal path which does not include the register, and further having an output coupled to the input/output pad, the first buffer adaptable to be under the control of a first signal from the programmable interconnect matrix; and
   a second buffer having an input coupled to the input/output pad, the second buffer adaptable to be under the control of a second signal from the programmable interconnect matrix.

27. A programmable input/output cell as in claim 26 wherein the register further comprises an input adaptable to be coupled to the programmable interconnect matrix.

28. A programmable input/output cell as in claim 27 wherein the second buffer further comprises an output adaptable to be coupled to the programmable interconnect matrix.

29. A method, comprising:
   receiving a first bit of data at a first register of a first of a plurality of input/output cells of a programmable logic device having a programmable interconnect matrix (PIM), the first register having an output coupled to a dedicated signal path to a pair of adjacent ones of the plurality of input/output cells, the dedicated signal path separate from the PIM; and
   shifting the first bit from the first register to a second register of one of the pair of adjacent input/output cells via the dedicated signal path.

30. The method of claim 29 further comprising transmitting the first bit from the second register to the PIM.

31. The method of claim 30 further comprising receiving a second bit of data at the first register, the first and second bits comprising a serial data stream.

32. The method of claim 29 further comprising:
   receiving a second bit of data at the first register; and
   transmitting the first bit from the second register and the second bit from the first register to the PIM in parallel.

33. The method of claim 29 further comprising:
   receiving a second bit of data at the first register; and
   transmitting the second bit from the first register to a first input/output pad and the first bit from the second register to a second input/output pad in parallel.

34. The method of claim 29 wherein said first bit is received from the PIM and further comprising transmitting the first bit from the second register to the PIM.

35. The method of claim 29 wherein the first bit is received from the PIM and further comprising transmitting the first bit from the second register to an input/output pad.

36. A method, comprising:
   receiving a first bit of a parallel data word at a first register of a first of a plurality of input/output cells of a programmable logic device including a programmable interconnect matrix (PIM), the first register having an input adaptable to be coupled to the PIM and an output adaptable to be coupled to a first input/output pad and coupled to a dedicated signal path to a pair of adjacent ones of the plurality of input/output cells and separate from the PIM;
   receiving a second bit of the parallel data word at a second register of one of the pair of adjacent ones of the plurality of input/output cells, the second register having an input adaptable to be coupled to the PIM or the dedicated signal path and an output adaptable to be coupled to a second input/output pad;
   shifting the second bit from the second register to the second input/output pad; and
   shifting the first bit from the first register to the second register via the dedicated signal path.

* * * * *